(12) United States Patent
Yoo et al.

(10) Patent No.: US 6,516,244 B1
(45) Date of Patent: Feb. 4, 2003

(54) WAFER ALIGNMENT SYSTEM AND METHOD

(75) Inventors: Woo Sik Yoo, Palo Alto, CA (US); Kitaek Kang, Dublin, CA (US)

(73) Assignee: WaferMasters, Inc., San Jose, CA (US)

( * ) Notice: Subject to any disclaimer, the term of this patent is extended or adjusted under 35 U.S.C. 154(b) by 47 days.

(21) Appl. No.: 09/648,833

(22) Filed: Aug. 25, 2000

(51) Int. Cl.[7] .................................................. G06F 7/00
(52) U.S. Cl. ........................ 700/218; 700/59; 700/259; 414/936; 901/47
(58) Field of Search ................................. 700/213, 218, 700/259, 59; 414/936, 939; 901/47

(56) References Cited

U.S. PATENT DOCUMENTS

| | | | |
|---|---|---|---|
| 4,326,805 A | 4/1982 | Feldman et al. | 356/399 |
| 4,457,664 A | 7/1984 | Judell et al. | 414/779 |
| 4,475,122 A | 10/1984 | Green | 358/101 |
| 4,819,167 A | 4/1989 | Cheng et al. | 364/167.01 |
| 4,955,780 A | 9/1990 | Shimane et al. | 414/44.2 |
| 5,497,007 A | 3/1996 | Uritsky et al. | 250/491.1 |
| 5,740,034 A * | 4/1998 | Saeki | 364/167.01 |
| 5,740,062 A | 4/1998 | Berken et al. | 364/478.06 |
| 5,905,850 A * | 5/1999 | Kaveh | 395/94 |
| 5,915,915 A * | 6/1999 | Allen et al. | 414/744.1 |
| 5,917,601 A | 6/1999 | Shimazaki et al. | 356/375 |
| 5,990,650 A * | 11/1999 | Brock | 318/640 |
| 6,135,854 A * | 10/2000 | Masumura et al. | 451/6 |
| 6,275,742 B1 * | 8/2001 | Sagues et al. | 700/213 |
| 6,298,280 B1 * | 10/2001 | Bonora et al. | 700/218 |

FOREIGN PATENT DOCUMENTS

| | | | |
|---|---|---|---|
| EP | 0 502 412 | 9/1992 | H01L/21/00 |
| EP | 0 747 945 | 12/1996 | H01L/21/66 |

OTHER PUBLICATIONS

DT Vision Foundry, Internet Article, *www.datatranslation.com*, handout (3 pgs.).
Sherlock Machine Vision Software, General Purpose Machine Vision Application, Imaging Technology 1997–99 (2 pgs.).
Digital Image Processing, Principles and Applications, Gregory A. Baxes, pp. 129–159 (15 pgs.).

* cited by examiner

*Primary Examiner*—Khoi H. Tran
(74) *Attorney, Agent, or Firm*—MacPherson Kwok Chen & Heid LLP (57) ABSTRACT

A system and associated method for aligning semiconductor wafers and wafer-like objects relative to a transport mechanism. An image of, for example, a wafer is acquired, digitized, and stored in a computer as an array of pixels, each pixel representing a point on the image. Data points along the edge of the wafer are extracted and used to geometrically estimate the center of the wafer object. The estimated wafer center is then compared to the position of a predetermined reference position to determine an offset. Using this information, the wafer transport mechanism can then be re-adjusted to pick up the wafer on the corrected center.

7 Claims, 8 Drawing Sheets

WAFER ALIGNMENT SYSTEM AND METHOD

BACKGROUND OF THE INVENTION

1. Field of the Invention

The present invention generally relates to semiconductor manufacturing equipment and more particularly to a wafer positioning system and method for positioning a semiconductor wafer.

2. Description of the Related Art

Semiconductor manufacturing equipment is used to process semiconductor wafers into electronic devices. Commonly, the equipment utilizes a number of different processing chambers accessible from a central wafer transfer chamber. Typically, the wafers are loaded into the processing system using a wafer carrier. A transfer mechanism, generally a robot, moves the individual wafers from the carrier, through valves, and into the various processing chambers. The robot may also move individual wafers between processing chambers to effect different processing steps. The movement of the wafers throughout the processing system is accomplished using automated handling techniques.

For reasons associated with manufacturing costs, processing times, and fabrication requirements, the volume of the overall processing system is kept to a minimum. Because of the limited volume, clearances and tolerances within the equipment system are necessarily minimized. In one such processing system, the clearance between a wafer and the walls of the equipment can be as little as a few millimeters. Unfortunately, with such limited space, wafers that become misaligned while being transported through the processing system may become dislodged, may be considerably damaged, and/or may cause damage to the processing equipment. As expected, breakage of wafers and/or damage to equipment is undesirable since each wafer and each component of the manufacturing equipment, represents a substantial investment to the manufacturer.

Typically, to precisely transport wafers through automated processing systems, wafer transport mechanisms or robots may be used. The robots are capable of performing precise and repeated tasks. However, the effectiveness of the wafer handling is dependent on the accuracy of the initial wafer position relative to the wafer transport robot.

Wafer processing systems may employ one or more techniques to precisely align the wafer transport robot and the wafer. In one technique, wafer positions are preferably detected by determining the position of the wafer transport robot when the leading and trailing edges of a wafer cross one or more optical beam paths during wafer transport. Position information derived from the wafer position data points may be compared with predetermined, nominal position information to determine the extent of the wafer misalignment. The misalignment information is preferably converted into a linear error component and a rotational error component. The linear extension and rotational displacement of the wafer transport robot is adjusted accordingly. In this example, the technique can be a relatively complex procedure, which usually leads to increased cost, increased equipment size, and increased processing time.

SUMMARY OF THE INVENTION

The present invention provides a system and associated method for aligning semiconductor wafers and wafer-like objects relative to a wafer transport mechanism. In the present invention, an image of a wafer is acquired using, for example, a CCD camera. The image is digitized and stored in a computer as an array (i.e. row and column) of pixels, each pixel representing a point on the image. The presence of a wafer against a contrasting background generates an intensity variation in the pixels of the acquired image. The discontinuity in the intensity in the pixels is typically associated with a boundary (e.g. an edge). Data points identified along the edge of the wafer are extracted and used to geometrically estimate the center of the wafer. As described in more detail below, the estimated wafer center is then compared to the position of a predetermined reference position to determine an offset. Using this information, the wafer transport mechanism can then be re-adjusted to pick up the wafer on the corrected center.

In the present invention, a single image of the wafer is needed, which allows for fast wafer positioning, while using minimal moving parts.

As described in more detail below, the single acquired wafer image can be used to orient the wafer, as needed, for processing. The present invention accomplishes the orientation task with less complexity, less cost and fewer sensors then most other techniques.

In one aspect of the present invention, a semiconductor wafer positioning system is provided. The system includes a transport mechanism, which is configured to transport a semiconductor wafer to and from one of a plurality of processing chambers. A position detection sensor provides an image from which a position of the wafer can be determined relative to a reference point.

In another aspect of the present invention, a method is provided for locating a position of a wafer. The method includes acquiring image data of a wafer for processing; processing the image data to determine the position of the center of the wafer; and moving a wafer transport assembly relative to the wafer to orient the wafer transport assembly relative to the center of the wafer.

Other uses, advantages, and variations of the present invention will be apparent to one of ordinary skill in the art upon reading this disclosure and accompanying drawings.

DETAILED DESCRIPTION

The present invention provides a system and associated method for aligning semiconductor wafers and wafer-like objects. The invention may be used in a variety of applications including the manufacture of semiconductor devices, hard disks, and liquid crystal displays. By way of example, but without limitation, the invention can be used in systems for etching, deposition, chemical-mechanical planarization, and rapid thermal processing. Wafer positions are preferably determined as a wafer is transferred from a wafer carrier to a processing chamber. Also, it may be desirable to determine wafer positions for transfers of wafers between processing chambers. Similarly, the wafer alignment can also be preferably determined each time the wafer is transported.

Figure 1:
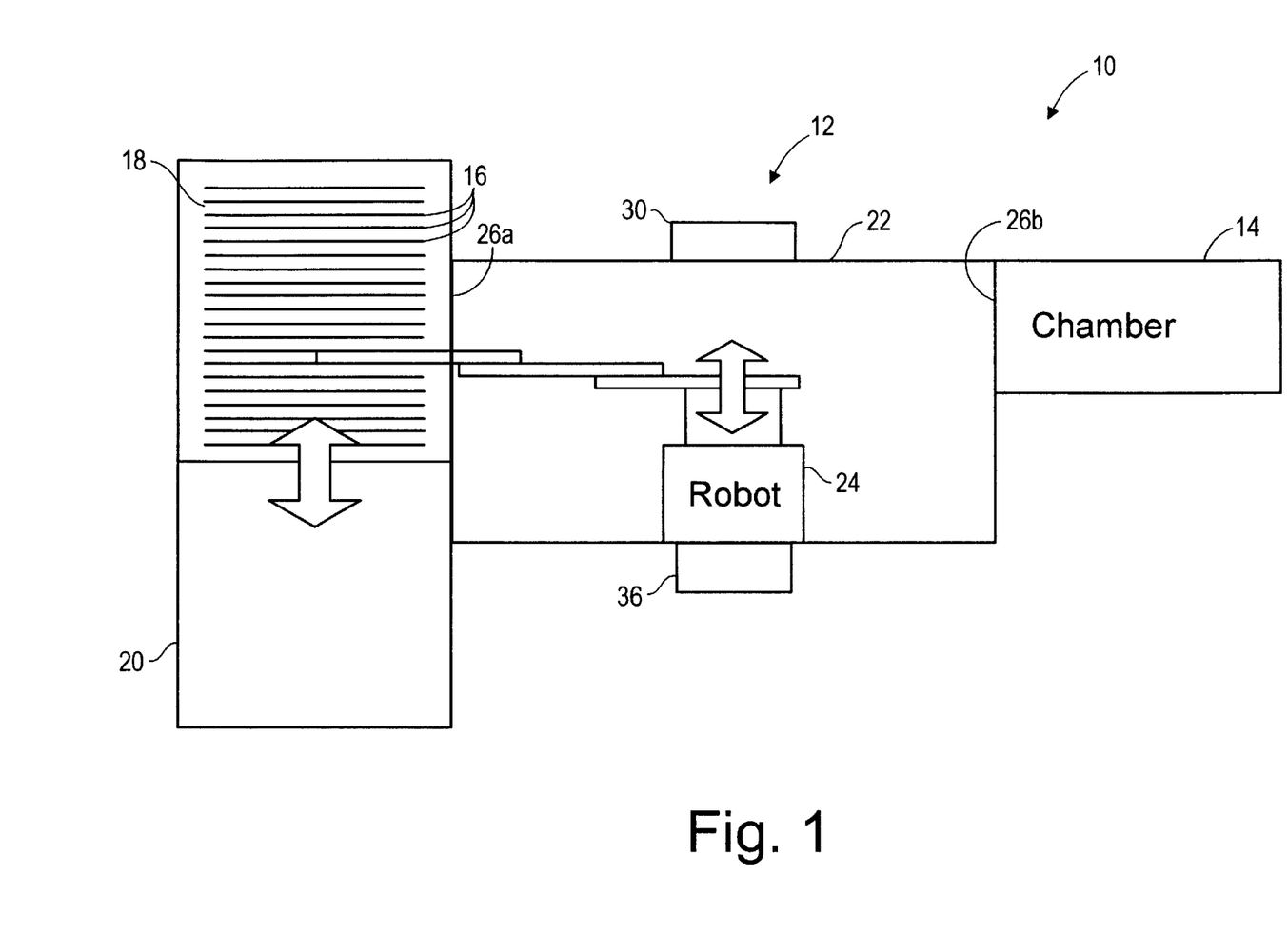
FIG. 1 is a simplified diagram of a wafer processing system in accordance with an embodiment of the present invention.

FIG. 1 is a simplified diagram of a wafer processing system 10, which may accommodate wafer positioning system 12 of the present invention. Wafer processing system 10 of FIG. 1 includes at least one processing chamber 14 or, alternatively a plurality of processing chambers (not shown), in each of which wafers undergo any one of a variety of processing steps. Typically, a plurality of wafers 16 are disposed within a wafer cassette or carrier 18. Carrier 18 is loaded into wafer processing system 10 from a wafer storage elevator 20. During processing, each wafer 16 is transported from wafer storage elevator 20 through transfer chamber 22 and into processing chamber 14. Movement of wafer 16 is accomplished using wafer transport assembly 24, housed within transfer chamber 22. Wafer transport assembly 24 is capable of removing wafer 16 from wafer carrier 18 and, through a combination of linear and rotational translations, transporting the wafer through vacuum chamber valves 26a and 26b, and depositing wafer 16 at the appropriate position within wafer processing chamber 14. Similarly, wafer transport assembly 24 is capable of transporting wafer 16 from one processing chamber 14 to another and from a processing chamber back to wafer storage elevator 20.

Figure 2A:
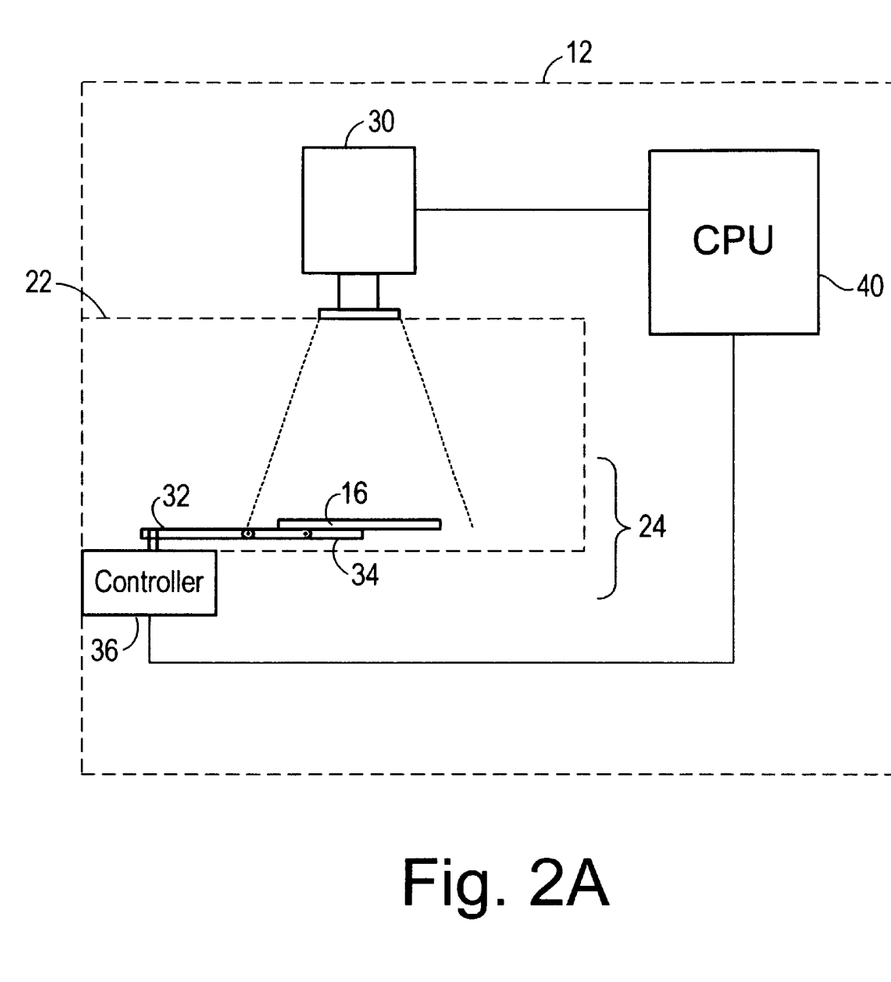
FIG. 2A is a simplified schematic illustration of an embodiment of a wafer positioning system in accordance with the present invention.

FIG. 2A is a simplified schematic diagram of wafer transfer chamber 22 including wafer positioning system 12 of the present invention. In one embodiment, wafer positioning system 12 includes an image sensor 30, the wafer transport assembly 24, a controller 36, and a central processing unit (CPU) 40.

Image sensor 30 of the present invention, illustrated in the diagram of FIG. 2A, may be mounted using conventional mounts on the outside of transfer chamber 22. The mounts allow for positioning and fine adjustment of image sensor 30. The conventional mounts are capable of holding image sensor 30 in position during normal processing operations. An opening or transparent viewing port (made, for example, from quartz) may be provided in transfer chamber 22. Image sensor 30 can view the interior of transfer chamber 22 through the viewing port. Once mounted, camera 30 can have a field of view to include from a portion, to all, of the interior of transfer chamber 22, which includes the entirety of wafer 16. In one embodiment, camera 30 is positioned over wafer 16 with a view angle of between 0° (e.g. directly above the wafer) and 30°; preferably between about 0° and 5°. While FIG. 2A illustrates a specific example of image sensor 30 positioned in processing system 10, the invention is not so limited. For example, image sensor 30 may not be mounted directly across or at a certain distance from wafer 16. This is because once an image is acquired, conventional image processing techniques can be used to digitally "tilt" or to "zoom" to a specific portion of the acquired image to accommodate various camera mount configurations.

The image of wafer 16 acquired by image sensor 30 is used to provide wafer position data (e.g. the center coordinate of the wafer), which enables wafer positioning system 12 to precisely position wafer 16 in processing chamber 14 (FIG. 1). For the purpose of acquiring this data, image sensor 30 may be any conventional camera, such as a CCD camera, a video camera, a photographic camera, or a digital camera. In one embodiment, camera 30 may be a QUICK-CAM™ Home camera from Logitech Corporation of Fremont, Calif. As will be described in greater detail below, the image acquired using camera 30 is provided to CPU 40 for subsequent image processing. If the Logitech QUICK-CAM™ Home camera is used, the output of camera 30 is a digitized image, which is provided to CPU 40 via a Universal Serial Bus ("USB") (not shown). If camera 30 is other than a digital camera, the image acquired is first digitized using a conventional digitizer before the image is processed in CPU 40. The output signals from camera 30 are applied as input signals to CPU 40 for use in computing the center coordinate of wafer 16 (and offset, as described below). The output signals from CPU 40 can be applied to controller 36 for controlling the operation of R (translational) and θ (rotational)drive motors, as well as other drive motors, to enable the required precise positioning operations of wafer positioning system 12. Details of the motor control circuitry are conventional and will be readily tailored by those of usual skill in the art to a particular system.

The digitized image output from image sensor 30 may be stored as a bitmap. Bitmaps are known in the art. Generally, a bitmap can be thought of as an array of pixels, each pixel representing a point on the digitized image. By knowing the resolution of the bitmap, the number of pixels in each row and the number of pixels in each column of the bitmap are also known. For example, a 640×480 bitmap has 480 rows and 640 columns of pixels. Each pixel in a selected column is extracted and converted to units of red, green, and blue ("RGB") intensity or normal gray scale intensity. The resulting intensity values of all pixels in the selected column can be loaded into a spreadsheet or application program for processing. The invention can be performed using any pixel or image format. For example, each pixel in the selected column can also be converted to the so-called HSV format. Further, pixel unit values (e.g. intensity values) may be scaled and normalized to improve the contrast between a wafer and its background.

In the initial setup of wafer positioning system 12 for a particular processing system 10, it will typically be necessary to ascertain the exact position of image sensor 30 with respect to a reference position. Therefore, a calibration can be done to determine, for example, an expected nominal center position 50 (FIG. 3A) of a wafer within transfer chamber 22.

Figure 3A:
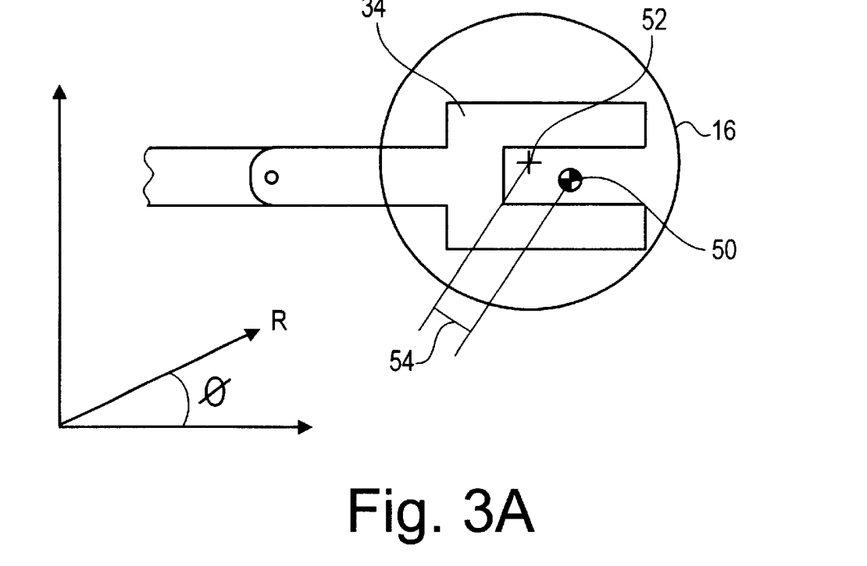
FIGS. 3A and 3B are simplified illustrations of the relative positions of a wafer to the end effector and the reference position before and after alignment, respectively, according to an embodiment of the invention.

As described in more detail below, wafer positioning system 12, and more specifically end effector 34 (FIG. 3A) may be centered in a calibration procedure relative to nominal center position 50 (FIG. 3A). The position information derived from the calibration procedure is generally stored in R, θ coordinates for use in future determinations of wafer position. The calibration procedure is accomplished by calibrating image sensor 30, as installed in wafer processing system 12, with the particular combination of motors, linear and rotational translation linkages, wafer end effector 34, and storage elevator 20, that combined form wafer processing system 10. Typically, a calibration such as this will need to be performed after the initial installation of image sensor 30 in wafer processing system 10 and whenever the alignment of image sensor 30 or the wafer transport system 12 is altered after initial installation.

In one embodiment, the calibration procedure begins using image sensor 30 to take an initial image of the interior of transfer chamber 22 with end effector 34 disposed therein in its nominal operating position. In this embodiment, reference center position 50 is selected using conventional signal processing techniques as the ideal wafer center with respect to end effector 34 (See FIG. 3A). When wafer positioning system 12 initially brings a newly loaded wafer into transfer chamber 22, end effector 34 will be returned to its nominal R, θ position with respect to reference center position 50. It is understood that the ideal reference point will vary for end effectors or blades of variable descriptions. For example, with an end effector or blade which has a well or pocket, the ideal wafer center is preferably centered in the pocket.

Figure 4A:
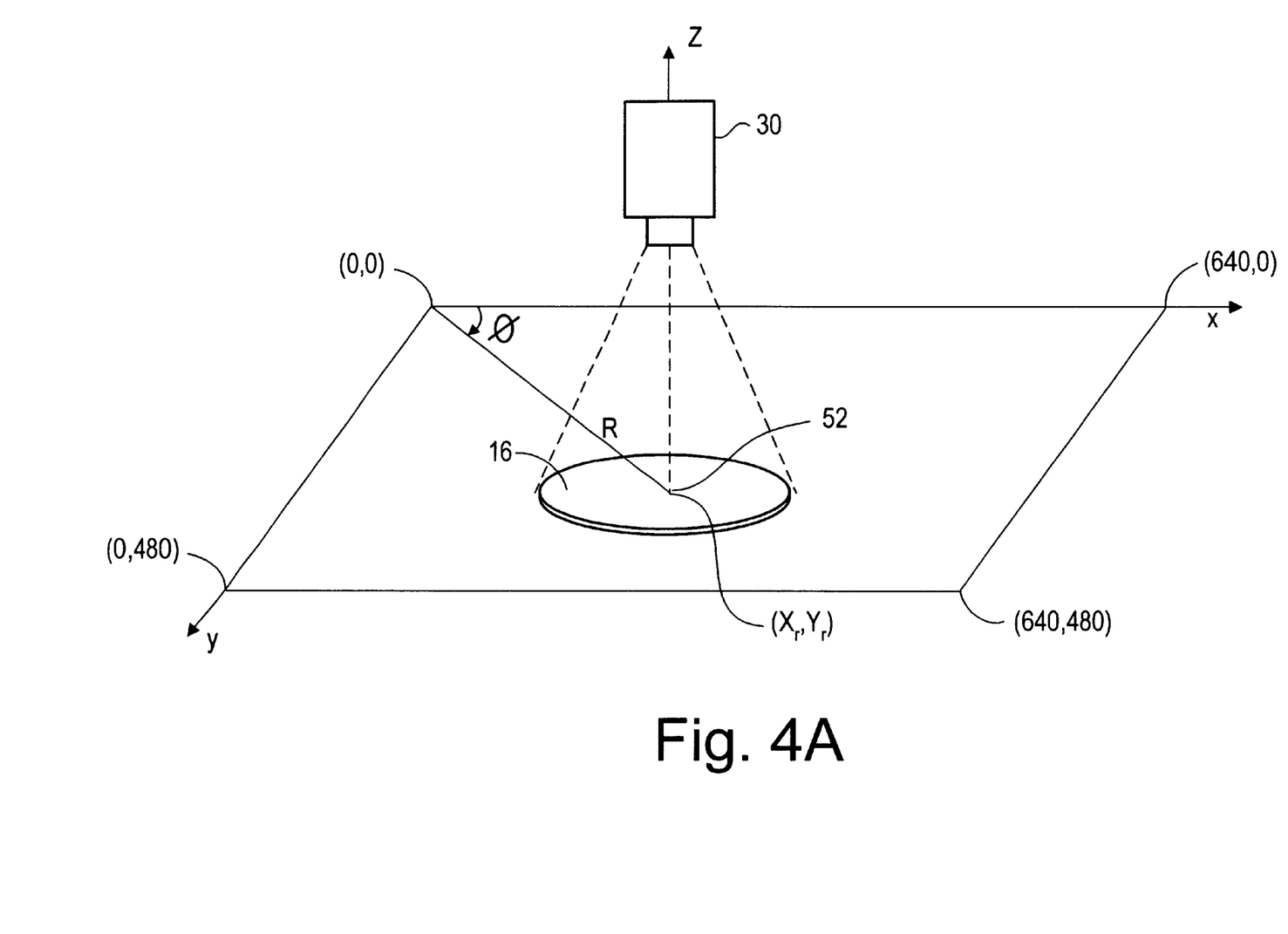
FIGS. 4A and 4B are illustrations of a coordinate system as defined by an embodiment of the present invention.

As shown in FIG. 4A, an −xyz coordinate system may be conveniently defined by the bitmap or pixel array (640×480) space. Once calibrated, for ease of calculation, reference position 50 of wafer positioning system 12 is converted from the R, θ coordinate system to the coordinate space of wafer positioning system 12. Thus, reference position 50 is converted from $R_r$, $θ_r$ to a point $X_r$, $Y_r$ using the relationship:

$$X_r = R_r(\cos θ)$$

$$Y_r = R_r(\sin θ)$$

Figure 2B:
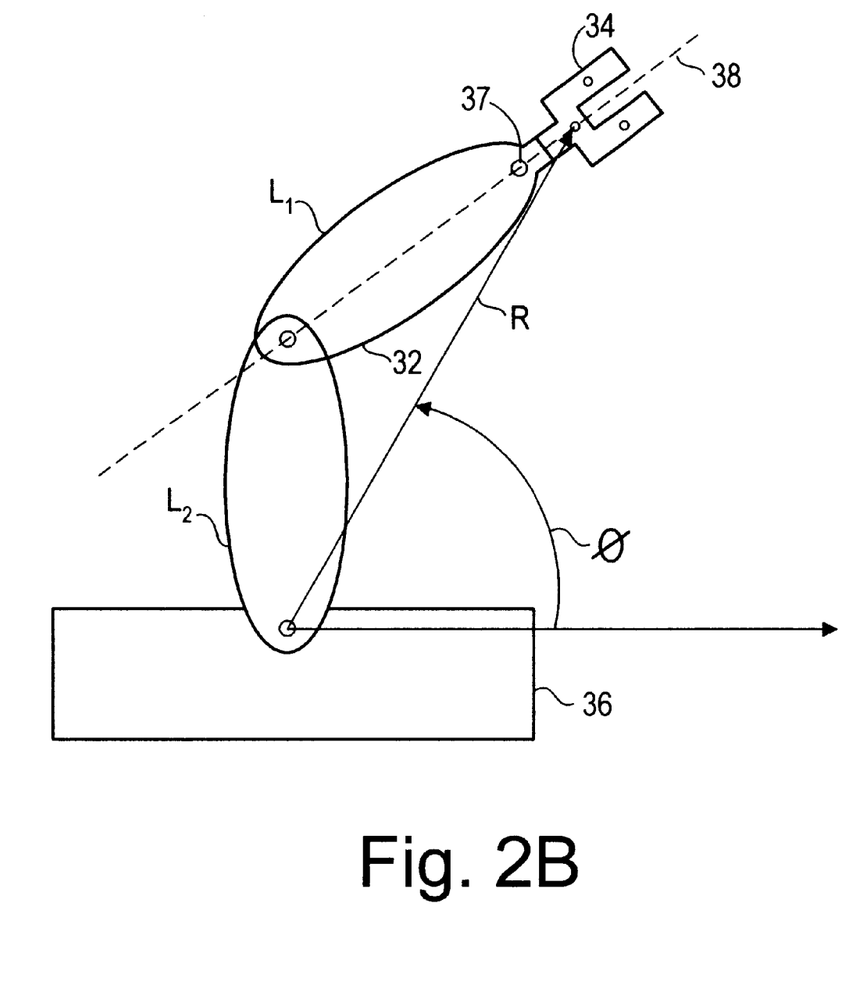
FIG. 2B is a simplified top plan view of an embodiment of a wafer transport assembly.

FIG. 2B is a simplified top plan view illustration of robot arm 32 in accordance with the present invention. In one embodiment, robot arm 32 may be a set of linkages, for example, $L_1$ and $L_2$, coupled together to provide translation (R) and rotation (θ) movements.

Also shown in FIG. 2B is end-effector 34. End effector 34 may be made of a heat resistant material such as quartz, for picking-up and placing wafer 16. In one embodiment, end-effector 34 is removably coupled to attachment block 37 which can accept a variety of end-effectors. Attachment block 37 is rotatably attached to robot arm 32 and can rotate relative to axis 38. A conventional belt and pulley arrangement can be used in a well-known manner to cause the movement of both robot arm 32 and end effector 34. An example of a commercially available wafer processing robot is the SHR3000 robot ("SHR3000 robot") from the JEL Corporation of Hiroshima, Japan. The SHR3000 robot can rotate 340°, has 200 mm of vertical motion, and can extend its arms 390 mm in the horizontal plane. Another example of a wafer processing robot for use with the present invention is disclosed in commonly assigned U.S. patent application Ser. No. 09/451,677, filed Nov. 30, 1999, which is herein incorporated by reference for all purposes.

Robot arm 32 is controlled by controller 36. Controller 36 derives wafer position information from information provided by camera 30. As is schematically illustrated in FIG. 2A, controller 36 is coupled to CPU 40. Controller 36 may use at least two stepper motors under the ultimate control of CPU 40. In one embodiment, CPU 40 controls the stepper motors in accordance with output signals from camera 30, with one stepper motor controlling linear extension R and the other stepper motor controlling rotation θ. The use and control of such stepper motors for this purpose is well known.

Referring now to FIGS. 1, 2A, 2B, 3A, and 3B the method of the present invention begins as end effector 34 on robot arm 32 obtains wafer 16 from wafer carrier 18. Robot arm 32 transports wafer 16 into transfer chamber 22, such that end effector 34 is disposed at its nominal position $(X_r, Y_r)$ in transfer chamber 22.

In one embodiment, wafer 16 is lowered onto standoffs (not shown) in chamber 22, so that end effector 34 no longer contacts wafer 16. Camera 30 acquires an image of wafer 16 and outputs the image data to CPU 40 for image processing. In an alternative embodiment, output signals from camera 30 may have to be routed through a digitizer (not shown) before being supplied to CPU 40. Central processing unit 40 receives the digital image data and uses well-known edge detection and morphological techniques to detect the wafer's edge.

The edge detection technique is a tool for extracting image components that are useful in the representation and description of shape boundaries and the like. This technique is used herein to determine an outline of the wafer. An edge is a boundary between two regions with relatively distinct gray-level properties. The edge is detected by distinguishing discontinuities in the gray-level where the transition between two regions occurs. An edge map can be created from the detection of the edge. An edge map is an intrinsic image, which contains the likelihood that a pixel belongs to an edge.

Typically, a small neighborhood of pixels, such as a 3×3 or 5×5 array of pixels, is analyzed. All points that are similar are linked forming a boundary of pixels that share common properties, such as strength and direction. Using the well-known concept of using the gradient for image differentiation, the gradient is defined as:

$$\nabla f = \begin{bmatrix} G_x \\ G_y \end{bmatrix} = \begin{bmatrix} \partial f / \partial x \\ \partial f / \partial y \end{bmatrix}$$

and $$\nabla f = mag(\nabla f) = [G_x^2 + G_y^2]^{1/2}$$

Thus an edge coordinate (x', y') in the neighborhood of (x, y) is similar in magnitude to the pixel at (x, y) if:

$$|\nabla f(x,y) - \nabla f(x',y')| \leq T$$

where T is a nonnegative threshold. The direction of the gradient vector is given by:

$$\alpha(x,y) = \tan^{-1}(G_y/G_x)$$

Thus, an edge pixel at (x',y') in the neighborhood at (x,y) has a similar angle to the pixel (x, y) if:

$$|\alpha(x,y) - \alpha(x',y')| < A$$

where A is an angle threshold.

Edge detection techniques are well described in R. Gonzales and R. Woods, "Digital Image Processing", Addison-Wesley Publishing Co., 1993, pgs. 518–560, and generally described in G. Baxes, "Digital Image Processing: Principles and Applications," Wiley and Sons, Inc. 1994, which are herein incorporated by reference for all purposes.

Once the outline of the wafer is known, CPU 40 can use well-known mathematical relationships to estimate the location of the wafer center $(X_n, Y_n)$ in the −xy plane.

Figure 4B:
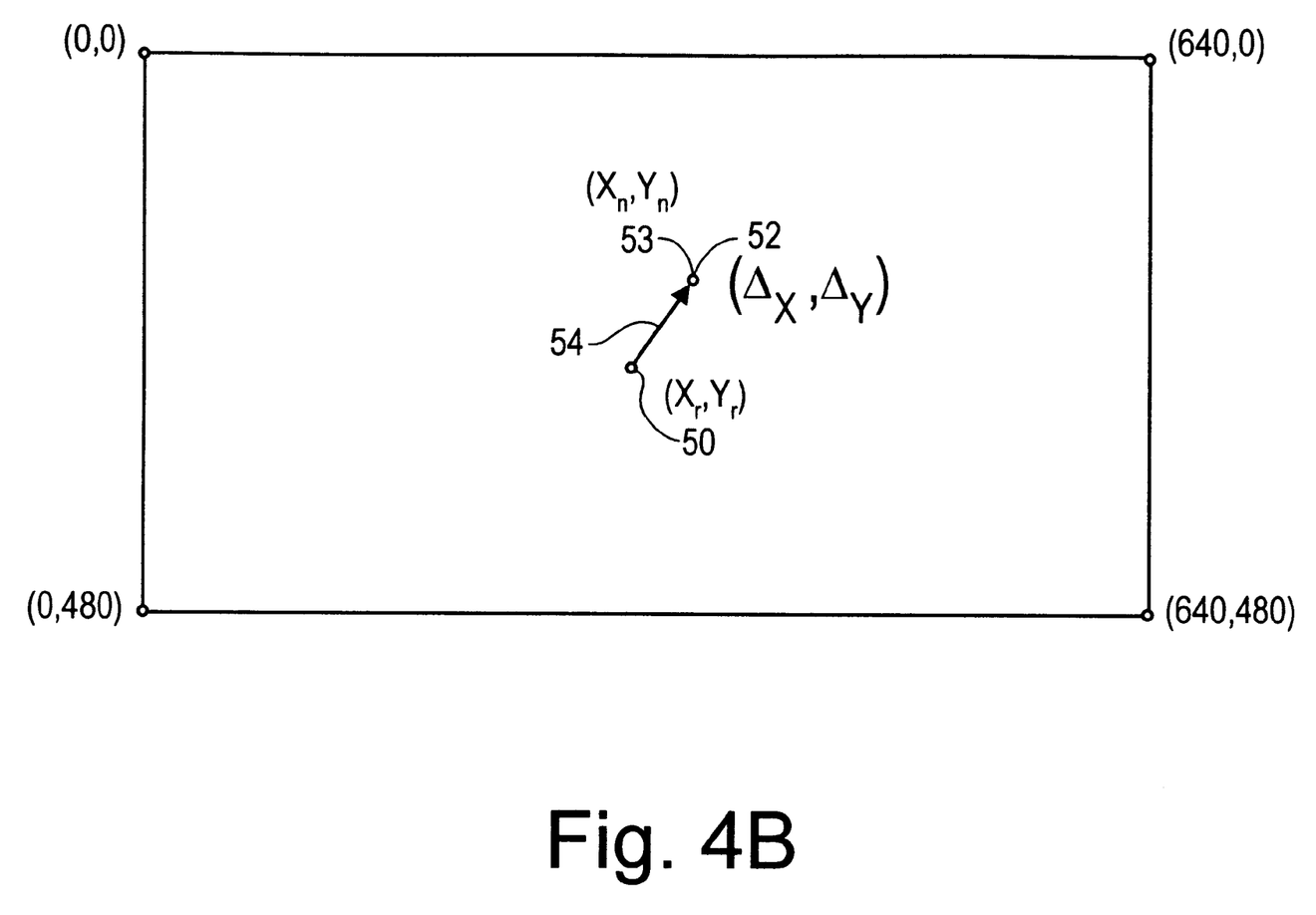

As shown in FIG. 4B, after the center of wafer 16 is calculated in the −xyz coordinate system, it can be compared to reference center $(X_r, Y_r)$ 50 to determine an offset vector (ΔX, ΔY) 54 from reference center 50. Offset vector 54 is calculated using conventional mathematical relationships. For example, offset vector 54 can be found by the relationship:

$$(\Delta X, \Delta Y) = ((X_n - X_r), (Y_n - Y_r))$$

Next, offset vector 54 is multiplied by scaling factor β. The scaling factor takes into account the resolution of the system. Scaling factor β is the ratio of robot physical dimensions to pixel dimensions. The scaling factor includes the size of the robot, the relative position of the robot to the camera, the zoom angle, the tilt angle, and other physical features.

Robot reference center 50 is adjusted to correspond to wafer center 52 to become the adjusted robot center ($X_{rn}$, $Y_{rn}$) 53 using the relationship:

$$X_{rn}=X_r+(\Delta X)\beta$$

$$Y_{rn}=Y_r+(\Delta Y)\beta$$

Adjusted robot center 53, can then be converted into the R, θ coordinate system as follows:

$$R_n=SQRT((X_{rn})^2+(Y_{rn})^2) \; \theta_n=\tan^{-1}(Y_{rn}/X_{rn})$$

Figure 3B:
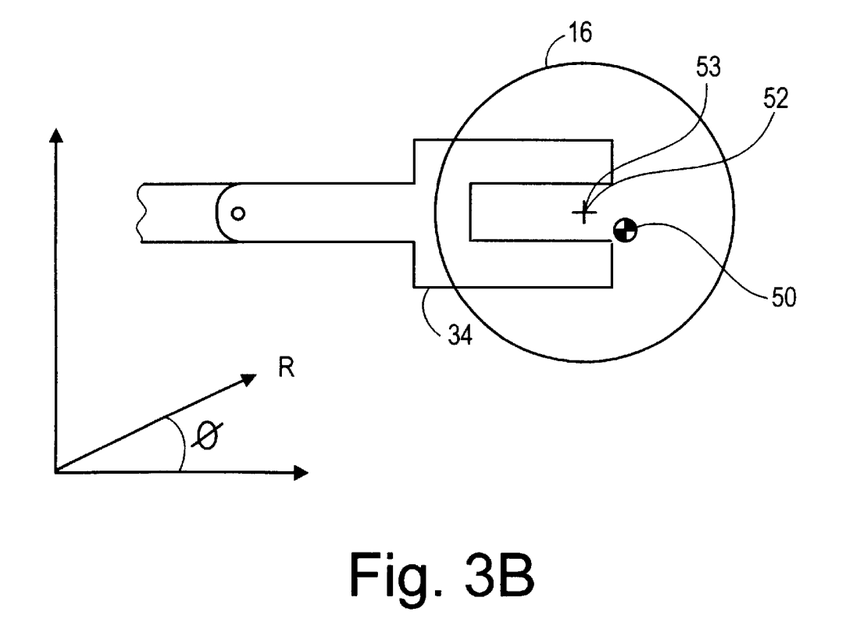

Once the coordinates are transformed, CPU 40 instructs controller 36 to adjust end effector 34 to the new position $R_n$, $\theta_n$. Accordingly, as shown in FIG. 3B, end effector 34 is centered about estimated wafer center 52. Hence, as wafer 16 is transported to processing chamber 14 or back to carrier 18, wafer 16 shall be accurately centered relative to wafer positioning system 12.

General purpose image processing software can be used to perform many of the calculations described above. One such software package is SHERLOCK, available from iMAGING Technology, Inc. of Bedford, Mass. Another image processing application for use with the present invention is DT Vision Foundary™, available from Data Translation, Inc. of Marlboro, Mass.

Figure 5:
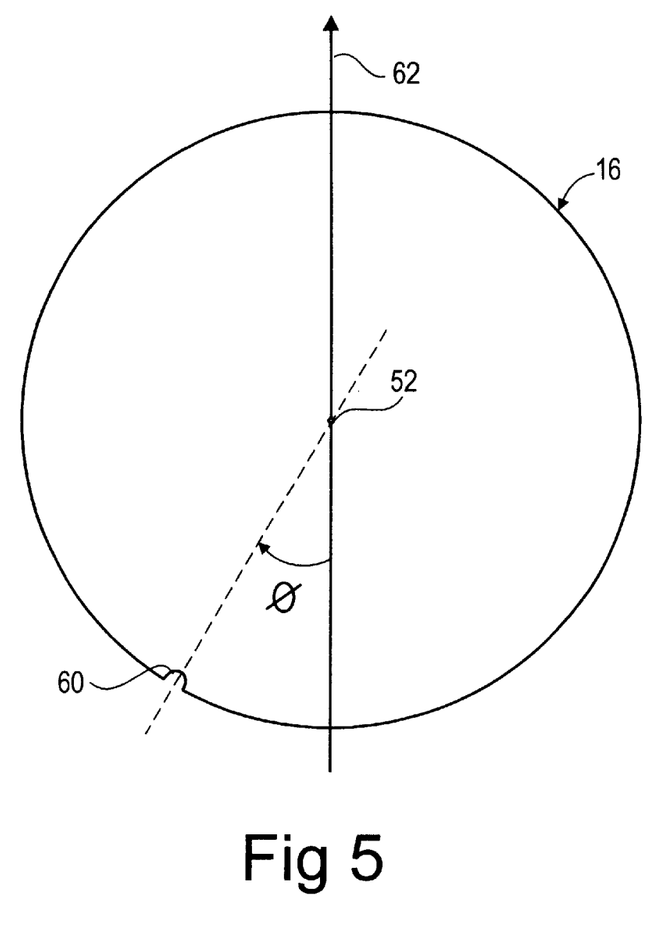
FIG. 5 is a simplified illustration of a wafer used in accordance with the present invention.

In another embodiment of the present invention, wafer positioning system 12 may be used to align the wafer in the system. As shown in FIG. 5, typically, a point of reference 60, usually a notch, is positioned on the edge of wafer 16. It is important in some processing systems, for some diagnostic purposes, to know the orientation of reference point 60 relative to a reference axis 62 during processing operations. Reference axis 62 can be any reference axis, but may typically be the axis corresponding to the direction of wafer travel (i.e., wafer path). Using the techniques described above, center 52 of wafer 16 and reference point 60 can be estimated.

Figure 6A:
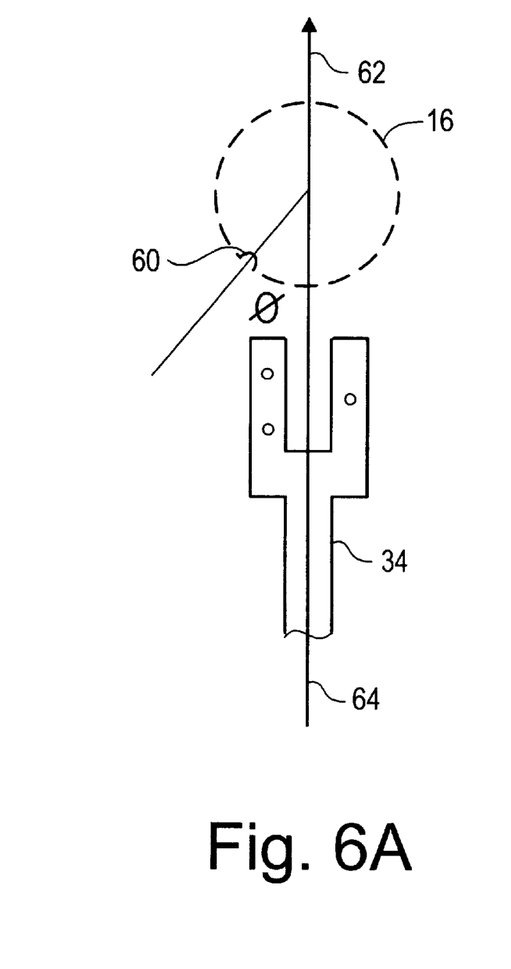
FIGS. 6A–6C are simplified illustrations of an alternative embodiment of the present invention.
Figure 6B:
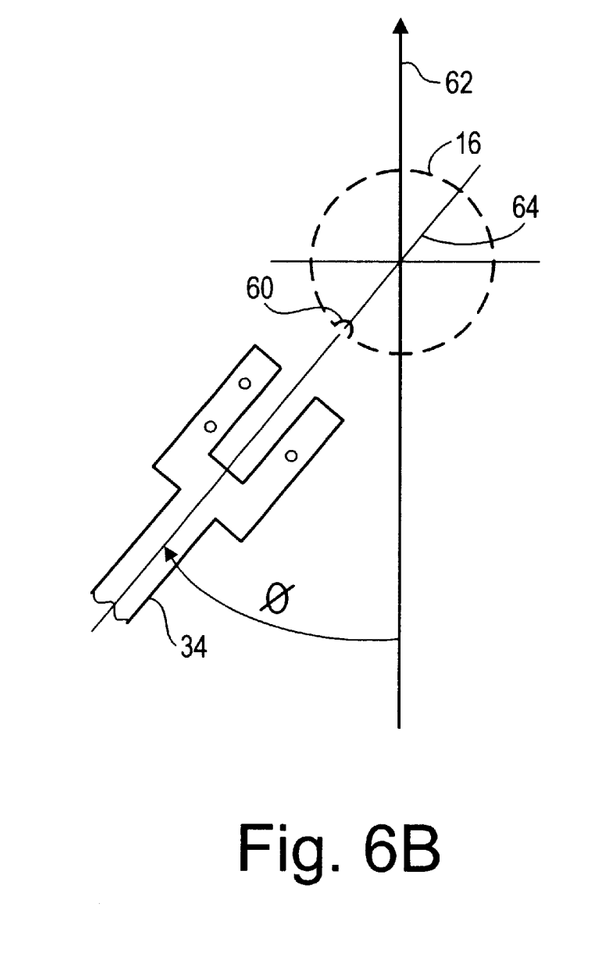
Figure 6C:
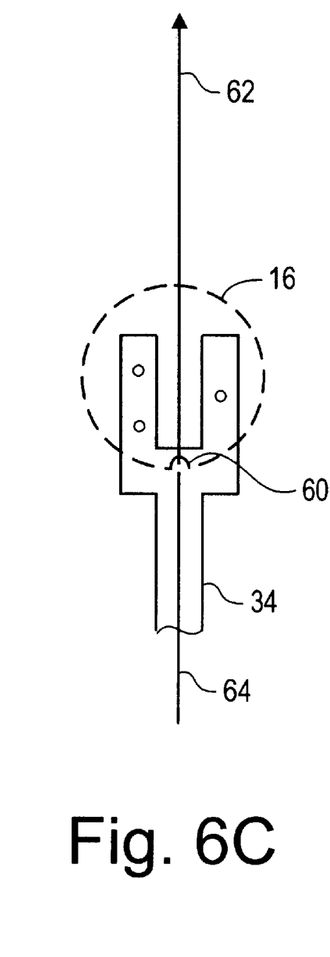

Since the radius of the wafer is known or can be measured prior to processing, an angle φ can be calculated between reference axis 62 and reference point 60. After converting the location of reference point 60 to R, θ coordinates, end effector 34 can be re-oriented from the orientation shown in FIG. 6A to the orientation shown in FIG. 6B. The re-orientation causes reference point 60 to be aligned with the centerline 64 of end effector 34. Thus, as shown in FIG. 6C, when end effector 34 is returned to the wafer path along reference line 62, reference point 60 is aligned with reference line 62.

In an alternative embodiment, wafer 16 may be disposed on a rotation mechanism. In this embodiment, once angle φ is calculated, the rotation mechanism rotates wafer 16 an angle φ, such that reference point 60 is aligned with reference axis 62 as shown in FIG. 6C.

The description of the invention given above is provided for purposes of illustration and is not intended to be limiting. The invention is set forth in the following claims.

What is claimed is:

1. A semiconductor wafer positioning system comprising:

a transport mechanism including an end effector configured to transport a semiconductor wafer to and from one of a plurality of processing chambers; and a position detection sensor providing an image from which an offset distance and direction can be determined between a first reference point determined with respect to said wafer and a second reference point determined with respect to said end effector, said wafer transport mechanism configured to move said end effector in response to said determination of said offset distance and direction to a position where said first reference point of said wafer and said second reference point are substantially co-located.

2. The positioning system of claim 1, further comprising a microprocessor coupled to said position detection sensor, said microprocessor being operable to detect a feature of the wafer in the image.

3. The positioning system of claim 1, further comprising a controller responsive to output signals from a microprocessor for controlling the transport mechanism for moving the transport mechanism relative to said wafer.

4. The positioning system of claim 1, wherein said transport mechanism comprises a robot.

5. The positioning system of claim 1, wherein said position detection sensor comprises a camera, said camera taken from the group consisting of a CCD camera, a video camera, a still camera, and a digital camera.

6. The positioning system of claim 1 wherein aid image is a digitized image.

7. A method comprising:

providing a transport mechanism including an end effector configured to transport a semiconductor wafer to and from one of a plurality of processing chambers;

imaging a wafer to determine an offset distance and direction between a first reference point determined with respect to said wafer and a second reference point determined with respect to said end effector; and moving said end effector in response to said determination of said offset distance and direction to a position where said first reference point of said wafer and said second reference point are substantially co-located.

\* \* \* \* \*